United States Patent
Cheah et al.

(10) Patent No.: US 6,858,942 B1
(45) Date of Patent: Feb. 22, 2005

(54) SEMICONDUCTOR PACKAGE WITH IMPROVED THERMAL CYCLING PERFORMANCE, AND METHOD OF FORMING SAME

(75) Inventors: Eng-Chew Cheah, San Jose, CA (US); Sydney Larry Anderson, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/635,182

(22) Filed: Aug. 5, 2003

Related U.S. Application Data

(62) Division of application No. 09/715,362, filed on Nov. 17, 2000, now Pat. No. 6,627,517
(60) Provisional application No. 60/169,733, filed on Dec. 8, 1999.

(51) Int. Cl.[7] .......................... H01L 23/48; H01L 23/52; H01L 29/40
(52) U.S. Cl. ....................... 257/782; 257/676; 257/709; 257/783
(58) Field of Search ................................ 257/676, 709, 257/782, 783

(56) References Cited

U.S. PATENT DOCUMENTS

| | | | |
|---|---|---|---|
| 5,068,708 A | * 11/1991 | Newman | 257/668 |
| 5,440,452 A | * 8/1995 | Kitahara | 361/773 |
| 5,601,675 A | * 2/1997 | Hoffmeyer et al. | 156/94 |
| 5,736,780 A | * 4/1998 | Murayama | 257/673 |
| 5,756,380 A | * 5/1998 | Berg et al. | 438/126 |
| 5,874,784 A | * 2/1999 | Aoki et al. | 257/787 |
| 6,084,299 A | * 7/2000 | Questad et al. | 257/707 |
| 6,150,716 A | * 11/2000 | MacQuarrie et al. | 257/709 |
| 6,198,165 B1 | * 3/2001 | Yamaji et al. | 257/734 |
| 6,225,701 B1 | * 5/2001 | Hori et al. | 257/783 |
| 6,226,187 B1 | * 5/2001 | Questad et al. | 361/707 |

* cited by examiner

*Primary Examiner*—John F. Niebling
*Assistant Examiner*—Angel Roman
(74) *Attorney, Agent, or Firm*—Morgan, Lewis & Bockius LLP

(57) ABSTRACT

A semiconductor package includes a relatively thin substrate epoxy attached to a packaging substrate, such as a lead frame. A relatively thick semiconductor epoxy is attached to a semiconductor. The relatively thin substrate epoxy and the relatively thick semiconductor epoxy are attached to one another forming a stack including the packaging substrate, the relatively thin substrate epoxy, the relatively thick semiconductor epoxy, and the semiconductor. A housing encloses the stack.

9 Claims, 1 Drawing Sheet

SEMICONDUCTOR PACKAGE WITH IMPROVED THERMAL CYCLING PERFORMANCE, AND METHOD OF FORMING SAME

This application is a divisional of Ser. No. 09/715,362 filed Nov. 17, 2000 now U.S. Pat. No. 6,627,517.

This application claims priority to the U.S. Provisional Patent Application entitled, "Apparatus and Method for Packaging a Semiconductor," Ser. No. 60/169,733, filed Dec. 8, 1999.

BRIEF DESCRIPTION OF THE INVENTION

This invention relates generally to the packaging of semiconductors. More particularly, this invention relates to a technique for packaging a semiconductor to improve thermal cycling performance.

BACKGROUND OF THE INVENTION

Semiconductors are placed in packages and are then subjected to a variety of electrical and thermal tests. The thermal tests typically entail exposing the package to a series of low and high temperatures, referred to as thermal cycles. For example, it is common to expect a packaged semiconductor to withstand at least 1000 thermal cycles between 1 and 100° C. Additional thermal cycles typically cause damage to the semiconductor. This damage arises largely from the mechanical stress placed on the semiconductor. This mechanical stress stems from the mismatch in the thermal coefficients of expansion between the semiconductor, the substrate upon which it is mounted, and the epoxy bonding it to the substrate.

In view of the foregoing, it would be highly desirable to improve the thermal cycling performance of packaged semiconductors. Preferably, the technique would be low cost and would rely upon known packaging techniques.

SUMMARY OF THE INVENTION

The method of the invention is a process for packaging a semiconductor. The method includes dispensing a substrate epoxy onto a packaging substrate. A semiconductor epoxy is then applied to a semiconductor. The substrate epoxy is then engaged with the semiconductor epoxy.

A semiconductor package of the invention includes a relatively thin substrate epoxy attached to a packaging substrate, such as a lead frame. A relatively thick semiconductor epoxy is attached to a semiconductor. The relatively thin substrate epoxy and the relatively thick semiconductor epoxy are attached to one another, forming a stack including the packaging substrate, the relatively thin substrate epoxy, the relatively thick semiconductor epoxy, and the semiconductor. A housing encloses the stack.

The relatively thick semiconductor epoxy forms a compliant interface that reduces the stress imposed upon the semiconductor during thermal cycling. Thus, the package of the invention leads to extended semiconductor life. The relatively thick semiconductor epoxy is easily applied to the semiconductor in a separate process using standard techniques, such as spinning. Advantageously, the substrate epoxy may be applied to the substrate in accordance with prior art techniques, thereby preventing any alteration in prior art package assembly techniques. The substrate epoxy provides adhesion to the semiconductor epoxy, which may be in a cured state. Since the invention relies upon known packaging techniques, the invention can be implemented relatively easily at low cost.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
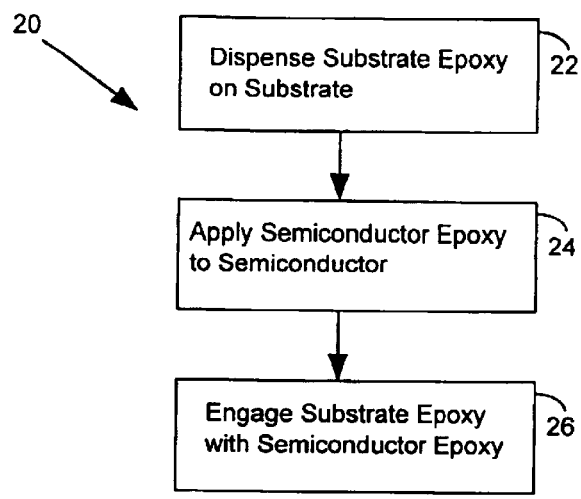
FIG. 1 illustrates processing steps performed in accordance with an embodiment of the invention.

FIG. 1 illustrates a process 20 performed in accordance with an embodiment of the invention. The process 20 includes the step of dispensing a substrate epoxy on a substrate (step 22). The substrate epoxy may be a standard conductive or non-conductive epoxy, depending upon the application. Typically, the substrate epoxy is machine dispensed onto a substrate, which is implemented as a lead frame. The substrate epoxy is relatively thin, typically on the order of approximately 2 mils or less.

The next processing step is to apply semiconductor epoxy to a semiconductor (step 24). The semiconductor epoxy is a standard conductive or non-conductive epoxy, depending upon the application. The semiconductor epoxy may be spun onto the semiconductor to form a relatively thick layer, typically on the order of approximately 5 mils or more. The epoxy is then cured in wafer form, using well known techniques.

The sequence of steps 22 and 24 is not important. Thus, in many applications it will be preferable to apply semiconductor epoxy to a semiconductor (step 24) prior to applying substrate epoxy to the substrate (step 22). The epoxy used in each step (i.e., step 22 and step 24) may be the same epoxy, thus, the term semiconductor epoxy refers to an epoxy on a semiconductor, while the term substrate epoxy refers to an epoxy on a substrate. By way of example, the epoxy may be any number of die attach adhesives sold by ABELSTIK LABORATORIES®, Rancho Dominguez, Calif.

The invention utilizes a relatively thin substrate epoxy and relatively thick semiconductor epoxy, meaning that the relatively thick semiconductor epoxy is approximately 2.5 times or more thicker than the relatively thin substrate epoxy. Those skilled in the art will appreciate that the relatively thick semiconductor epoxy is readily applied to a semiconductor in a separate process, but would be relatively difficult to apply to the substrate, causing alterations in standard processing techniques and leading to assembly mess.

The final processing step illustrated in FIG. 1 is to engage the substrate epoxy with the semiconductor epoxy (step 26). The substrate epoxy provides adhesion to the semiconductor epoxy, which is typically in a cured state.

Figure 2:
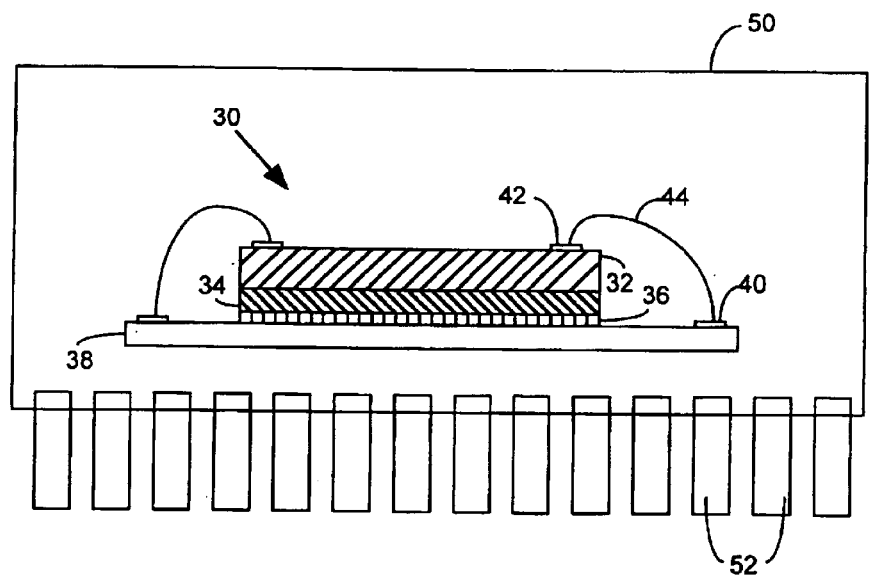
FIG. 2 illustrates a semiconductor package in accordance with an embodiment of the invention.

FIG. 2 illustrates a semiconductor stack 30 constructed in accordance with an embodiment of the invention. The stack 30 includes a semiconductor 32 with a semiconductor epoxy 34 attached to it. The figure also illustrates a substrate epoxy 36 attached to a substrate 38. Substrate bond pads 40 are positioned on the substrate 38. Semiconductor bond pads 42 are positioned on the semiconductor 32. Bond wires 44 link the semiconductor bond pads 42 to the substrate bond pads 40. The bond wires 44 may be applied using standard techniques after the processing of FIG. 1 is completed. Additionally, the stack 30 may be positioned in a housing 50, which includes pins 52. By way of example, the housing 50 may be an injected molded plastic housing.

Those skilled in the art will recognize a number of advantages associated with the technique of the invention. The relatively thick semiconductor epoxy reduces the stress imposed upon the semiconductor during thermal cycling. Thus, the package of the invention leads to extended semiconductor life. The relatively thick semiconductor epoxy is easily applied to the semiconductor in a separate process using standard techniques, such as spinning. Advantageously, the substrate epoxy, operating as an adhesion layer, may be applied to the substrate in accordance with prior art techniques, thereby preventing any alteration in prior art package assembly techniques. Since the invention relies upon known packaging techniques, the invention can be implemented relatively easily at low cost.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A semiconductor package, comprising:
   a relatively thin substrate epoxy attached to a packaging substrate;
   a relatively thick semiconductor epoxy attached to a semiconductor, the substrate epoxy and the semiconductor epoxy being made of the same epoxy, wherein said relatively thin substrate epoxy and said relatively thick semiconductor epoxy are attached to one another forming a stack including said packaging substrate, said relatively thin substrate epoxy, said relatively thick semiconductor epoxy, and said semiconductor; and
   a housing enclosing said stack.

2. The semiconductor package of claim 1 wherein said relatively thick semiconductor epoxy is approximately 2.5 times or more as thick as said relatively thin substrate epoxy.

3. The semiconductor package of claim 1 wherein said relatively thick semiconductor epoxy is approximately 5 mils or more.

4. The semiconductor package of claim 1 wherein said relatively thin substrate epoxy is approximately 2 mils or less.

5. The semiconductor package of claim 1 wherein said packaging substrate is a lead frame.

6. A semiconductor package, comprising:
   a relatively thin substrate epoxy attached to a packaging substrate;
   a relatively thick semiconductor epoxy having a thickness of approximately 5 mils or more attached to a semiconductor, wherein said relatively thin substrate epoxy and said relatively thick semiconductor epoxy are attached to one another forming a stack including said packaging substrate, said relatively thin substrate epoxy, said relatively thick semiconductor epoxy, and said semiconductor; and
   a housing enclosing said stack.

7. The semiconductor package of claim 6 wherein said relatively thick semiconductor epoxy is approximately 2.5 times or more as thick as said relatively thin substrate epoxy.

8. The semiconductor package of claim 6 wherein said relatively thin substrate epoxy is approximately 2 mils or less.

9. The semiconductor package of claim 6 wherein said packaging substrate is a lead frame.

* * * * *